(12) United States Patent
Law et al.

(10) Patent No.: US 10,193,043 B2
(45) Date of Patent: Jan. 29, 2019

(54) LIGHT EMITTING DEVICE PACKAGE WITH REFLECTIVE SIDE COATING

(71) Applicant: Lumileds LLC, San Jose, CA (US)

(72) Inventors: Ruen-Ching Law, Balik Pulau (MY); Tze-Yang Hin, Batu Maung (MY)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/661,196

(22) Filed: Jul. 27, 2017

(65) Prior Publication Data
US 2018/0033935 A1 Feb. 1, 2018

Related U.S. Application Data

(60) Provisional application No. 62/368,067, filed on Jul. 28, 2016.

(51) Int. Cl.
*H01L 33/64* (2010.01)
*H01L 33/46* (2010.01)
*H01L 33/50* (2010.01)

(52) U.S. Cl.
CPC .............. *H01L 33/64* (2013.01); *H01L 33/46* (2013.01); *H01L 33/50* (2013.01); *H01L 2933/0025* (2013.01); *H01L 2933/0058* (2013.01); *H01L 2933/0075* (2013.01)

(58) Field of Classification Search
CPC ....... H01L 2933/0033; H01L 2933/005; H01L 2933/0066–2933/0091; H01L 33/48–33/648; H01L 27/156
See application file for complete search history.

(56) References Cited

U.S. PATENT DOCUMENTS

| | | | |
|---|---|---|---|
| 2010/0181582 A1* | 7/2010 | Li | H01L 33/44 257/91 |
| 2015/0263243 A1* | 9/2015 | Nakagawa | H01L 33/504 257/98 |
| 2015/0353740 A1* | 12/2015 | Kojima | H01L 33/46 362/296.04 |
| 2016/0240746 A1* | 8/2016 | Yun | H01L 33/502 |
| 2017/0133561 A1 | 5/2017 | von Malm | |
| 2017/0301835 A1 | 10/2017 | Singer et al. | |
| 2017/0309795 A1* | 10/2017 | Kim | H01L 33/504 |

FOREIGN PATENT DOCUMENTS

| | | |
|---|---|---|
| EP | 2221885 | 8/2010 |
| EP | 2642535 | 9/2013 |
| EP | 2833421 | 2/2015 |

\* cited by examiner

*Primary Examiner* — Julia Slutsker
(74) *Attorney, Agent, or Firm* — Volpe and Koenig, P.C.

(57) ABSTRACT

A light-emitting device is disclosed that includes a semiconductor structure having an active region disposed between an n-type layer and a p-type layer; a wavelength converter formed above the semiconductor structure; an insulating side coating formed around the semiconductor structure; and a reflective side coating formed around the wavelength converter above the insulating side coating, the reflective side coating having a top surface that is flush with a top surface of the wavelength converter.

20 Claims, 11 Drawing Sheets

_US 10,193,043 B2_

LIGHT EMITTING DEVICE PACKAGE WITH REFLECTIVE SIDE COATING

CROSS REFERENCE TO RELATED APPLICATIONS

This application claims the benefit of U.S. Provisional Application No. 62/368,067 filed on Jul. 28, 2016, which is incorporated by reference as if fully set forth.

FIELD OF INVENTION

The present disclosure relates to light emitting devices in general, and more particularly, to a light emitting device package with reflective side coating.

BACKGROUND

Light emitting diodes ("LEDs") are commonly used as light sources in various applications. The main functional part of an LED may be a semiconductor chip comprising two injecting layers of opposite conductivity types (p-type and n-type), and a light-emitting active layer of radiative recombination in which injection of carriers takes place. The semiconductor chip is usually placed in a package that provides electrical connections between the LED chip and the outside world, in addition to protection against vibration and thermal damage.

LED packaging can play a vital role in the removal of heat generated during the operation of LED devices. Poor heat dissipation can place LED devices under excessive thermal stress and have severe consequences on their performance. Excessive thermal stress can shorten the LED devices' life and lead to various types of failure, such as color drift, a decline in the transparency of lenses found in the LED devices, and reduced quantum efficiency. As a large portion of the power supplied to LEDs is converted to heat, it is essential that this heat is efficiently dissipated into the environment to ensure reliable performance.

Accordingly, the need exists for improved LED package designs that provide efficient heat dissipation.

SUMMARY

The present disclosure addresses this need. According to aspects of the disclosure, a light-emitting device is disclosed that includes a semiconductor structure having an active region disposed between an n-type layer and a p-type layer; a wavelength converter formed above the semiconductor structure; an insulating side coating formed around the semiconductor structure; and a reflective side coating formed around the wavelength converter above the insulating side coating, the reflective side coating having a top surface that is flush with a top surface of the wavelength converter.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1:
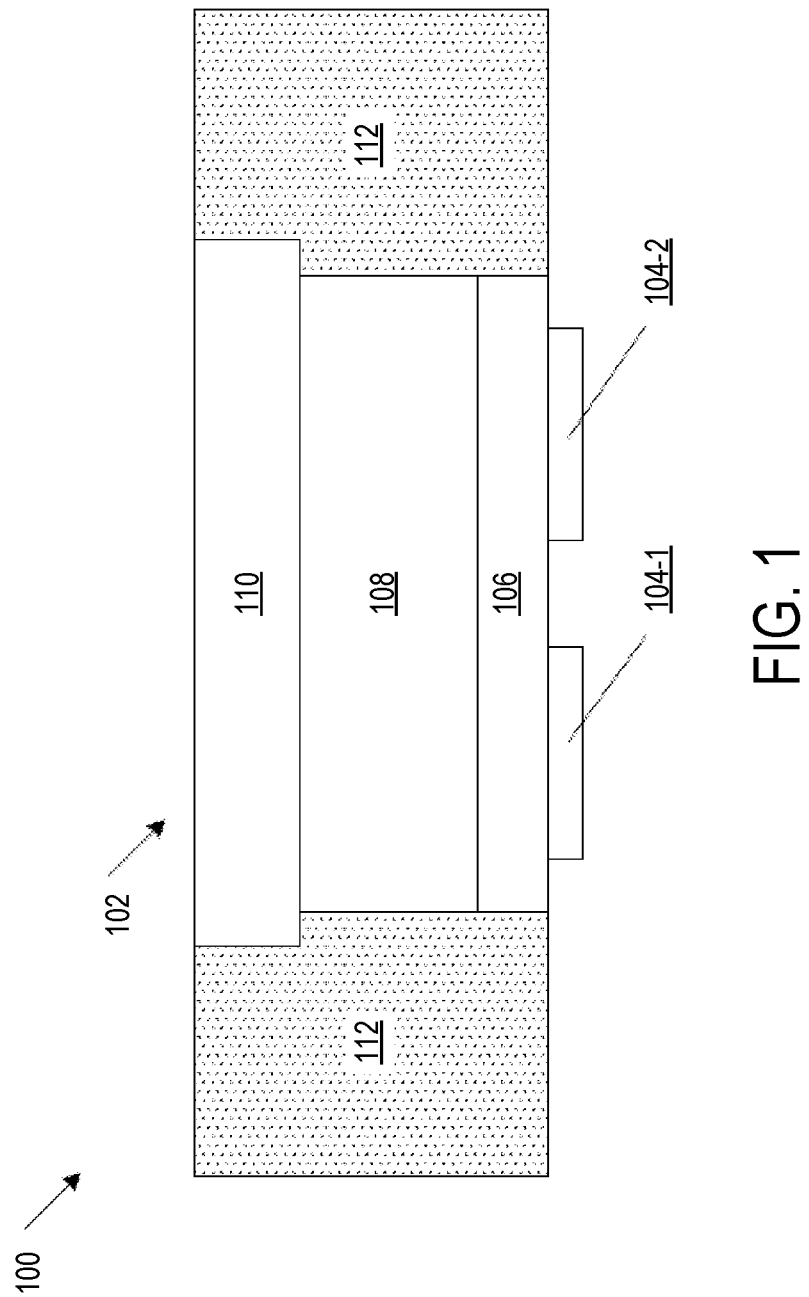
FIG. 1 is a cross-sectional view of an example of a light-emitting device, according to aspects of the disclosure.

According to aspects of the disclosure, a light emitting device is disclosed including a light-emitting semiconductor structure and a wavelength converter formed above the semiconductor structure. The semiconductor structure is at least partially surrounded by an insulating side coating. The wavelength converter is at least partially surrounded by a reflective side coating that is formed on top of the insulating side coating. Because the reflective coating is in thermal contact with the wavelength converter, the reflective side coating provides another path for the transfer of heat from the wavelength converter to the surrounding environment.

According to aspects of the disclosure, the reflective side coating may help protect the wavelength converter from overheating. Overheating, in general, may cause a color drift of the wavelength converter and shorten its useful life. By efficiently leading heat away from the wavelength converter, the reflective side coating may prolong the useful life of the wavelength converter and reduce the likelihood of it failing.

According to aspects of the disclosure, the insulating side coating prevents the reflective side coating from shorting the semiconductor structure. The insulating side coating may be formed of a dielectric material having a low thermal conductivity. The reflective side coating may be electrically conductive and it may have a high thermal conductivity. By stacking the reflective side coating onto the insulating side coating, a composite coating structure is formed that acts as a heat dissipation surface for the wavelength converter, while also providing electrical insulation for the semiconductor structure of the light emitting device.

According to aspects of the disclosure, the insulating side coating and the reflective side coating can be applied in a process that is scalable and cost efficient. The first side coating may be applied by a placing a first stencil around an LED die that includes a semiconductor structure and a wavelength converter. The stencil may define a first trench around the LED die which is filled with an insulating material. After the insulating material is applied in the first trench, the first stencil is removed. When the first stencil is removed, the insulating material is no longer contained in the first trench. As a result, the insulating material is drawn onto the walls of the LED die by capillary action to form the insulating side coating.

After the insulating side coating is at least partially formed, a second stencil is placed onto the LED die. The second stencil defines a second trench around the LED die which is filled with a reflective material. After the reflective material is applied in the second trench, the second stencil is removed. When the second is removed, the reflective material is no longer contained in the second trench. As a result, the reflective material is drawn to the walls of the LED die by capillary action.

According to aspects of the disclosure, the reflective material may be applied in sufficient quantities to substantially cover the semiconductor structure of the LED die when the insulating material is drawn onto the walls of the LED die. Furthermore, the reflective material may be applied in sufficient quantities to substantially cover the walls of the wavelength converter of the LED die, without overflowing onto the top of the wavelength converter, when the reflective material is drawn onto the walls of the LED die by capillary action.

According to aspects of the disclosure, the first stencil may differ from the second stencil. For example, the second trench that is defined by the second stencil may be deeper than the first trench. Furthermore, the second trench may be deeper than the height of the LED die to allow the reflective material to settle down to the height of the LED die when the second stencil is removed. In other words, the first trench may be sized to permit the application of insulating material in amounts sufficient to cover the sides of the semiconductor structure of the LED die when the first stencil is removed and the insulating material is settled down. Similarly, the second trench may be sized to permit the application of reflective material in amounts sufficient to cover the sides of the wavelength converter of the LED die when the second stencil is removed and the reflective material is settled down.

According to aspects of the disclosure, a light-emitting device is disclosed comprising: a semiconductor structure having an active region disposed between an n-type layer and a p-type layer; a wavelength converter formed above the semiconductor structure; an insulating side coating formed around the semiconductor structure; and a reflective side coating formed around the wavelength converter above the insulating side coating, the reflective side coating having a top surface that is flush with a top surface of the wavelength converter.

According to aspects of the disclosure, a light-emitting device is disclosed, comprising: an LED die including a semiconductor structure and a wavelength converter formed above the semiconductor structure; an insulating side coating formed around the LED die, the insulating side coating including a first binder material filled with reflective particles; and a reflective side coating formed around the LED die above the insulating side coating, the reflective side coating including a second binder material filled with metal powder, the reflective side coating being thermally coupled to the wavelength converter, and the reflective side coating having a top surface that is flush with a top surface of the wavelength converter.

According to aspects of the disclosure, a method for manufacturing a light-emitting diode (LED) package, comprising: placing an LED die on a support, the LED die including: a semiconductor structure having an active region disposed between an n-type layer and a p-type layer; and a wavelength converter formed above the semiconductor structure; forming an insulating side coating around the semiconductor structure; and forming a reflective side coating around the wavelength converter above the insulating side coating, the reflective side coating having a top surface that is flush with a top surface of the wavelength converter.

Examples of different LED packages will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1 is a cross-sectional diagram of an example of a chip scale package (CSP) of a light-emitting device 100, according to aspects of the disclosure. As illustrated, the device 100 comprises an LED die 102 including a semiconductor structure 106 coupled to bonding pads 104-1 and 104-2, a transparent substrate formed above the semiconductor structure 106, and a wavelength converter 110 formed above the transparent structure.

Figure 2:
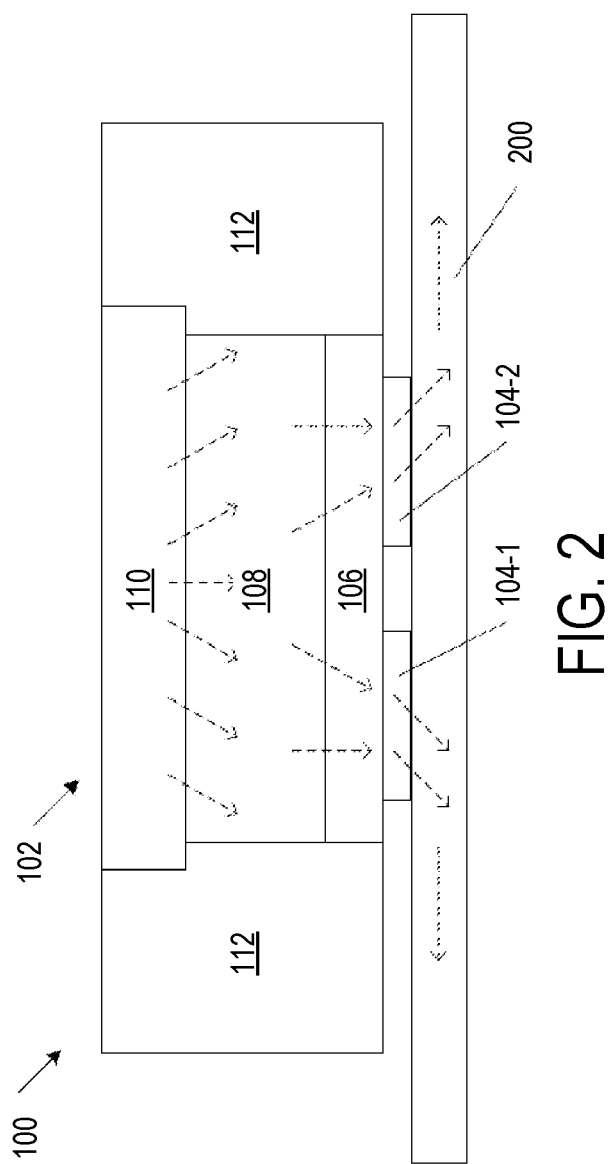
FIG. 2 is a cross-sectional view of the light emitting device of FIG. 1 illustrating the flow of heat out of the light-emitting device, according to aspects of the disclosure.

FIG. 2 is a cross-sectional view of the device 100 of FIG. 1 that illustrates the dissipation of heat from the device 100 when the device 100 is mounted on a support, such as a printed circuit board (PCB) 200. As illustrated, during normal operation of the device 100, the wavelength converter 110 generates heat (shown as phantom arrowed lines) that travels down from wavelength converter 110, through transparent substrate 108, out from bonding pads 104-1 and 104-2 into PCB 200. Very little heat escapes through the insulating side coating 112 because the insulating side coating 112 has low thermal conductivity. For example, a silicone/$TiO_2$ reflective side coating 112 has a thermal conductivity of 0.8 to 0.9 W/mK. Thus, as the size of the device 100 becomes smaller, additional heat paths are needed to dissipate the heat generated by the wavelength converter 110 to prevent the wavelength converter 110 and/or the LED die 102 from overheating.

Figure 3A:
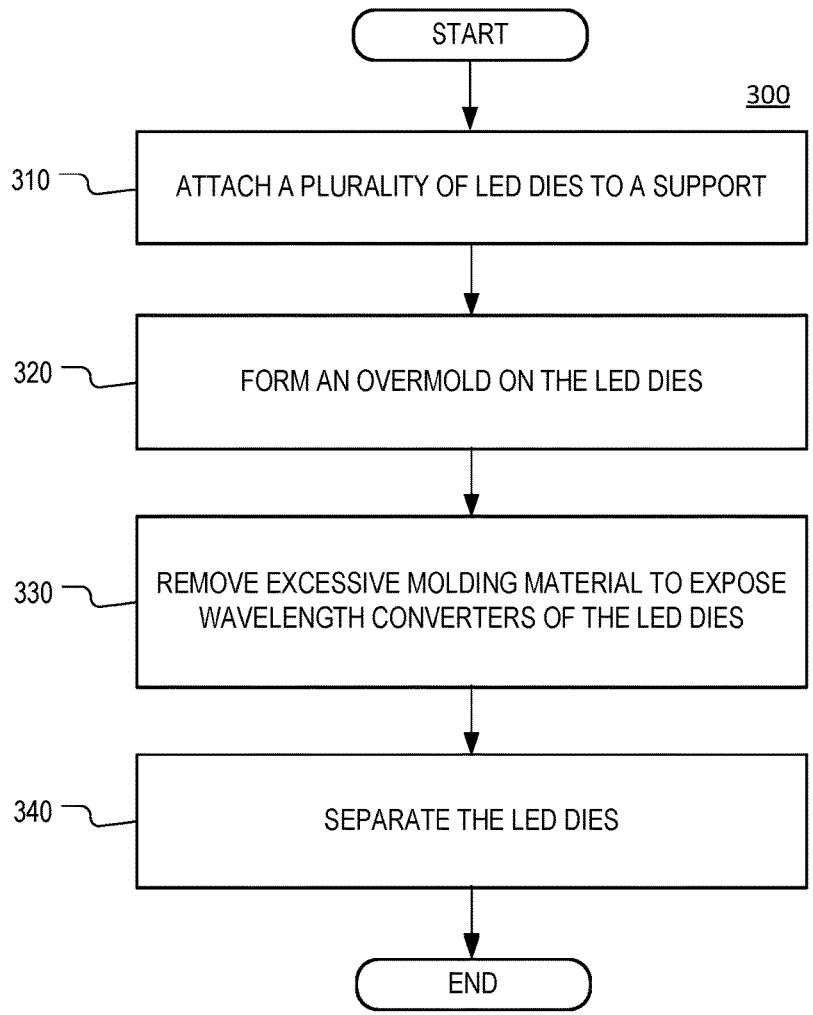
FIG. 3A is a flowchart of an example of a process for manufacturing light emitting devices, according to aspects of the disclosure.

FIG. 3A is a flowchart of a process 300 for manufacturing light-emitting devices, such as the device 100 of FIG. 1, according to aspects of the disclosure. The process 300 is described in conjunction with FIGS. 3B-E, which are cross-sectional views illustrating different manufacturing stages undergone by the light emitting devices.

Figure 3B:
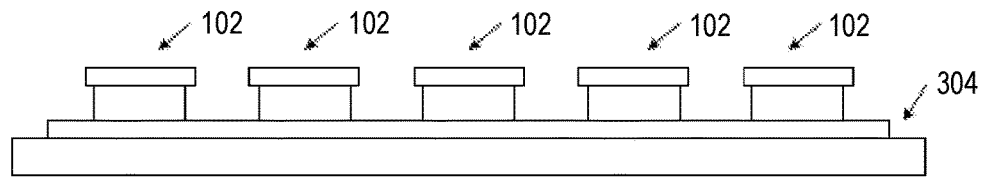
FIG. 3B is schematic diagram illustrating a step in the process of FIG. 3A, according to aspects of the disclosure.
Figure 3C:
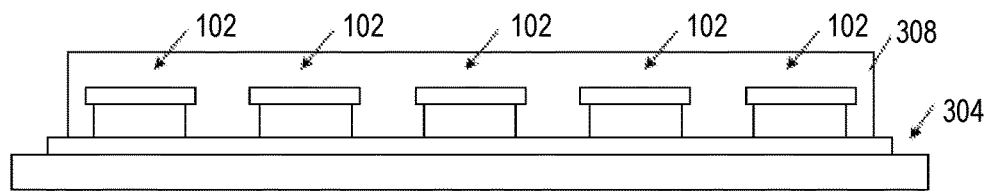
FIG. 3C is schematic diagram illustrating a step in the process of FIG. 3A, according to aspects of the disclosure.
Figure 3D:
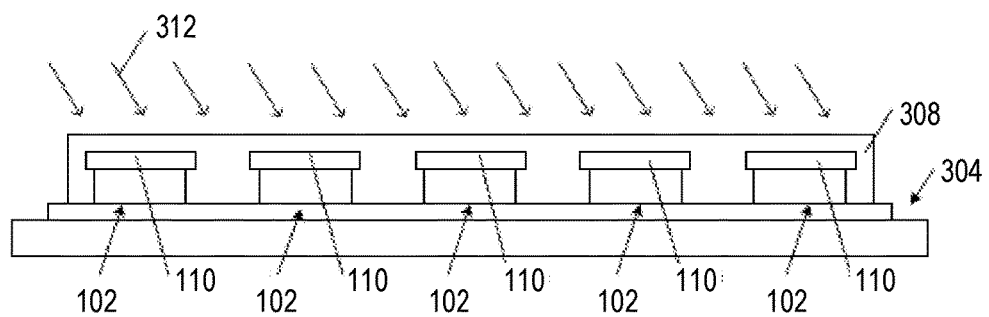
FIG. 3D is schematic diagram illustrating a step in the process of FIG. 3A, according to aspects of the disclosure.
Figure 3E:
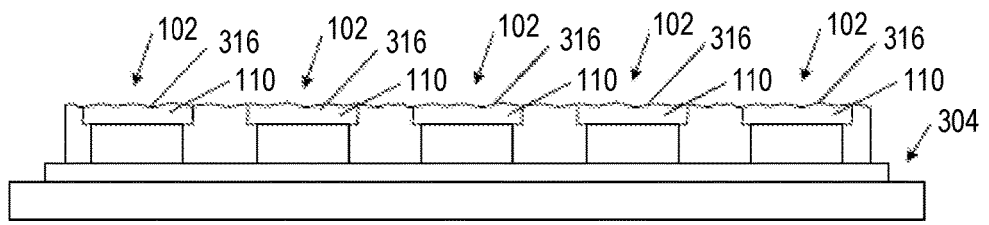
FIG. 3E is schematic diagram illustrating a step in the process of FIG. 3A, according to aspects of the disclosure.

At step 310, LED dies 102 are attached to a support 304, as shown in FIG. 3B. The support 304 may include an adhesive tape and/or any other suitable type of support. At step 320, an overmold 308 is formed to cover the LED dies 102, as shown in FIG. 3C. At step 330, the overmold is removed to expose wavelength converters 110 of LED dies 102, as shown in FIG. 3D. In some implementations, wet abrasive blasting 312, such as micro mold blast (WMBB), may be used to remove excessive mold material. As a result of the abrasive blasting, a surface 316 may be formed on each of the wavelength converters 110, as shown in FIG. 3E. At step 340, the LED dies 102 are separated from one another and the support 304.

Wet abrasive blasting techniques, such as WMBB, may have narrow parameter windows for water pressure, bead size, and slurry mixture, which could make it difficult to provide a flat surface on the wavelength converters 110. In this regard, FIG. 4E shows the effect on the surface 316 when these parameters are not controlled precisely. As illustrated in FIG. 4E, when one or more microblasting parameters are not controlled precisely, the surface 316 may become rough and uneven, which in turn may cause the LED dies 102 to produce colors different from their target specification.

Figure 4A:
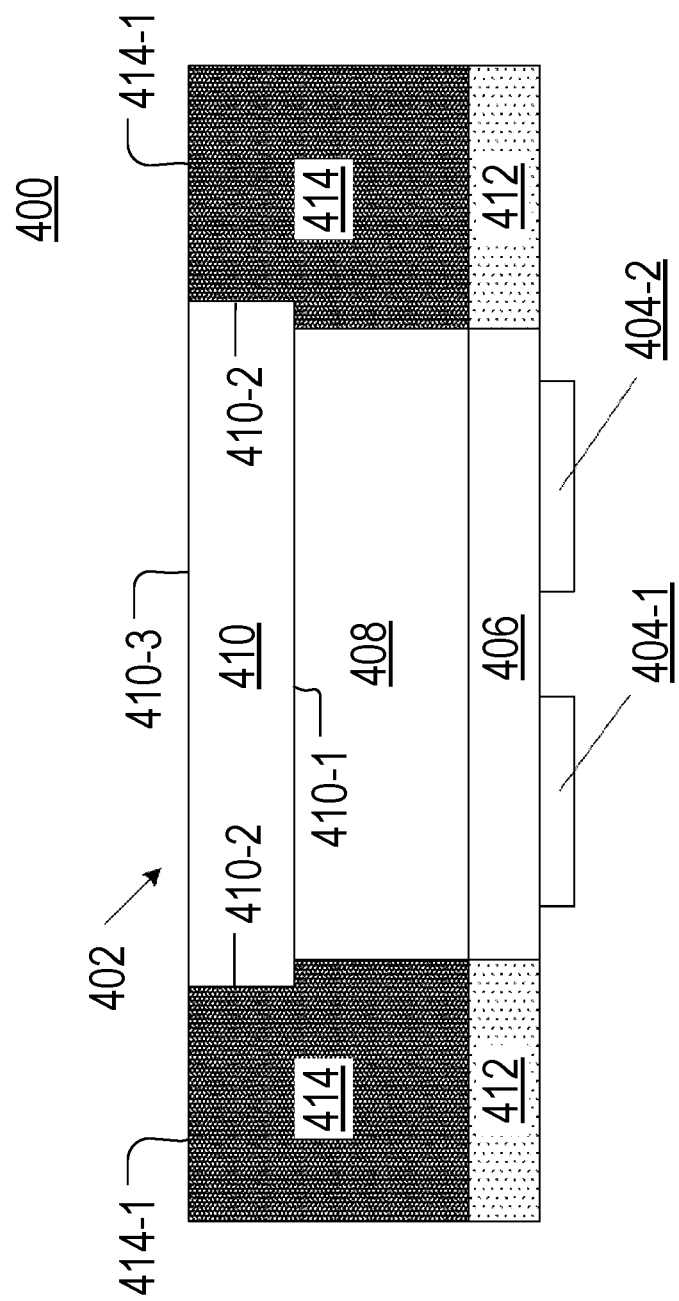
FIG. 4A is a schematic cross-sectional view of an example of a light-emitting device, according to aspects of the disclosure.

FIG. 4A is a cross-sectional diagram of an example of a chip scale package (CSP) of a light-emitting device 400, according to aspects of the disclosure. As illustrated, the device 400 includes a LED die 402 that is at least partially surrounded by an insulating side coating 412 and a reflective side coating 414. The reflective side coating 414 is formed above the insulating side coating 412, as shown.

The LED die 402 includes a semiconductor structure 406 coupled to bonding pads 404-1 and 404-2. The LED die 402 also includes a transparent substrate 408 disposed between the semiconductor structure 406 and a wavelength converter 410. Although in the present example the LED die 412 has a flip chip configuration, alternative implementations are possible in which the LED die 412 has any other suitable type of configuration.

The semiconductor structure 406 may be a semiconductor light source that is epitaxially grown on the transparent substrate 408. The semiconductor structure 406 may include an active layer sandwiched between an n-type layer and a p-type layer. When suitable voltage is applied to the bonding pads 404-1 and 404-2, charge carriers combine in the active layer and emit light as a result. In some implementations, the semiconductor structure 406 may include additional circuitry, such as circuitry for transient voltage suppression.

The transparent substrate 408, may be a sapphire substrate. However, alternative implementations are possible in which any other suitable type of substrate is used instead. Although in the present example, the substrate 408 is transparent, alternative implementations are possible in which the substrate 408 is opaque.

The wavelength converter 410 may include any suitable type of material that is arranged to change the frequency of light emitted by the semiconductor structure 406. For example, the wavelength converter 410 may include a phosphor coating or a ceramic phosphor plate. In operation, the wavelength converter may change blue light that is emitted by the semiconductor structure 406 to white light.

The insulating side coating 412 may include any suitable type of dielectric material that is capable of electrically insulating the semiconductor structure 406 from the reflective side coating 414. In some implementations, the insulating side coating 412 may include a binder material filled with reflective particles. For example, the insulating side coating 412 may include silicone mixed with $TiO_2$ or white solder mask. As another, the insulating side coating 412 may include epoxy mixed with $TiO_2$ or white solder mask. In some implementations, the insulating side coating 412 may substantially cover the sides of the 406-1 of the semiconductor structure 406 to prevent the reflective side coating 414 from shorting the semiconductor structure 406.

The reflective side coating 414 may include any suitable type of material that is capable of leading heat away from the wavelength converter 410. In some implementations, the reflective side coating may include a metal, such as silver. Additionally or alternatively, in some implementations, the reflective side coating 414 may include a binder material that is filled with metal powder. For example, the reflective side coating 414 may be formed of a silver paste material including solvent, binder, and additives that promote adhesion to the insulating side coating 412 and/or the wavelength converter 410.

In some implementations, the reflective side coating 414 may have a substantially higher thermal conductivity than the insulating side coating. For example, the insulating side coating 412 may have a thermal conductivity of 0.8 to 0.9 when it is formed of silicon filled with $TiO_2$, whereas the reflective side coating 414 may have a thermal conductivity of at least 200 W/Mk when it is formed of silver. As is further discussed below, the high thermal conductivity of the reflective side coating may help facilitate the transfer of heat out of the wavelength converter 410.

In some implementations, the insulating side coating 412 may be dielectric, while the reflective side coating may be electrically conductive. As a result, the insulating side coating 412 may protect the semiconductor structure 406 from shorting during manufacturing and prevent electro migration of the material of the reflective side coating (e.g., silver) during reliability testing.

In some implementations both the reflective side coating 414 and the insulating side coating 412 may reflect light from the sides to the top of the LED die 402 for improved luminous output. For example, when the reflective side coating 414 have reflectivity of 95% when is at least partially formed of silver. As another example, the insulating side coating 412 may have a reflectivity of 90% to 94% when it is formed of silicon filled with $TiO_2$.

In some implementations, the wavelength converter 410 may extend over the transparent substrate 408, thereby exposing a portion of the bottom surface 410-1 of the wavelength converter 410, as shown. As a result, the reflective side coating 414 may come in contact with both the bottom surface 410-1 and the side surfaces 410-2 of the wavelength converter. Arranging the wavelength converter 410 to extend over the transparent substrate 408 may thus increase the surface area of the wavelength converter 410 that is available to come in contact with the reflective side coating 414. The increase of surface area that comes in contact with the reflective side coating 414 may in turn increase the rate at which heat can be transferred from the wavelength converter 410 onto the side coating 414.

In some implementations, the top surface 414-1 of the reflective side coating 414 may be flush with the top surface 410-3 of the wavelength converter 410, as shown. Arranging the wavelength converter 410 and the reflective side coating 414 in this manner may prevent the reflective side coating 414 from blocking the emission of light from the top surface 410-3 of the wavelength converter. In other words, the manner in which the reflective side coating 414 is coupled to the wavelength converter 410 maximizes the light emitting surface of the device 400, while also providing for sufficient thermal coupling between the reflective side coating 414 and the wavelength converter 410.

Figure 4B:
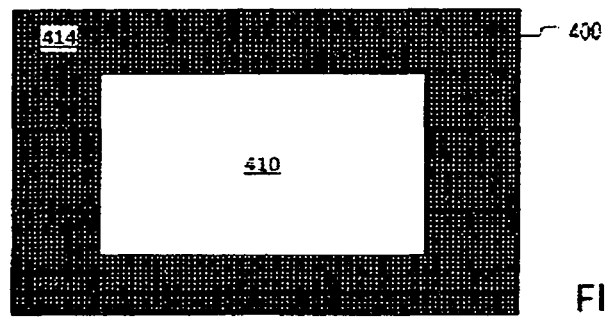
FIG. 4B is a schematic top-down view of the light-emitting of FIG. 4A, according to aspects of the disclosure.

FIG. 4B is a top-down view of the device 400 of FIG. 4A, according to aspects of the disclosure. As illustrated, in the example of FIG. 4B the reflective side coating 414 completely surrounds the wavelength converter 410. However, alternative implementations are possible in which the wavelength converter 410 is only partially surrounded by the reflective side coating 414.

Figure 4C:
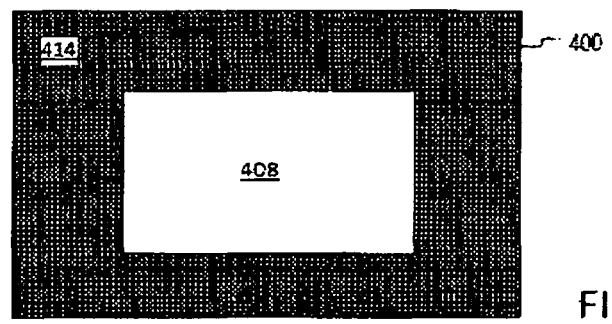
FIG. 4C is a schematic top-down view of the light-emitting device of FIG. 4A, according to aspects of the disclosure.

FIG. 4C is a top-down view of the device 400 of FIG. 4A with the wavelength converter 410 removed to reveal elements beneath it. As illustrated, in the example of FIG. 4C the reflective side coating 414 completely surrounds the transparent substrate 408. However, alternative implementations are possible in which the wavelength converter 410 is only partially surrounded by the reflective side coating 414.

Figure 4D:
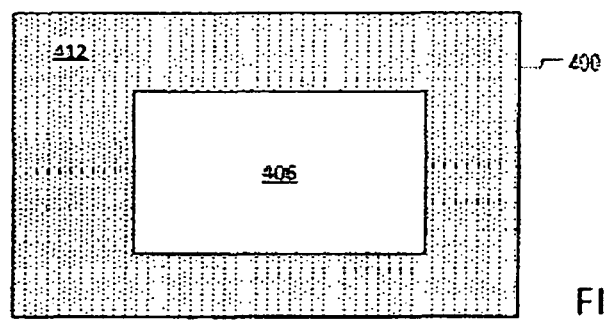
FIG. 4D is a schematic top-down view of the light-emitting device of FIG. 4A, according to aspects of the disclosure.

FIG. 4D is a top-down view of the device 400 of FIG. 4A, according to aspects of the disclosure. In FIG. 4D, the wavelength converter 410, the reflective side coating 414 and the transparent substrate 408 are removed to reveal the insulating side coating 412 and the semiconductor structure 406 beneath them. As illustrated, in the present example the insulating side coating 412 completely surrounds the semiconductor structure 406. However, alternative implementations are possible in which the semiconductor structure 406 is only partially surrounded by the insulating side coating 412.

Figure 5:
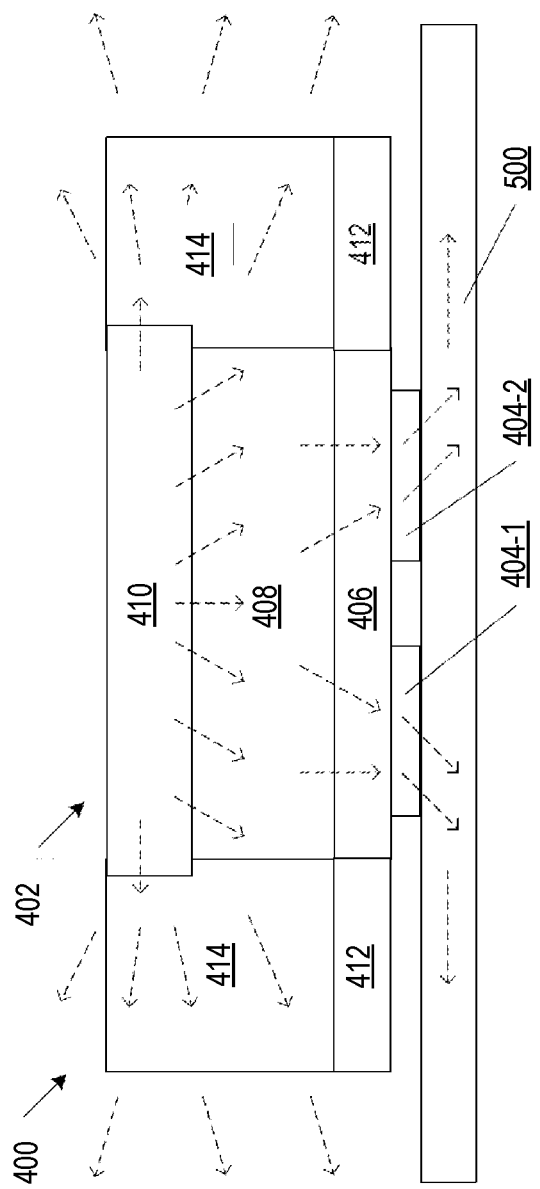
FIG. 5 is a cross-sectional view of the light-emitting device of FIG. 4A illustrating the flow of heat out of the light-emitting device, according to aspects of the disclosure.

FIG. 5 is a cross-sectional view of the device 400 of FIG. 4A that illustrates the dissipation of heat from the device 400 when the device 400 is mounted on a support, such as a printed circuit board (PCB) 500. As illustrated, the heat generated by the wavelength converter 410 (shown as phantom arrowed lines) travels down from wavelength converter 410, through transparent substrate 408, out from bonding pads 404-1 and 404-2 into PCB 500. The heat also travels from wavelength converter 410 out through reflective side coating 414. In some aspects, the additional heat path out that is afforded by the reflective side coating 414 allows the device 400 to be made smaller without overheating.

Figure 6A:
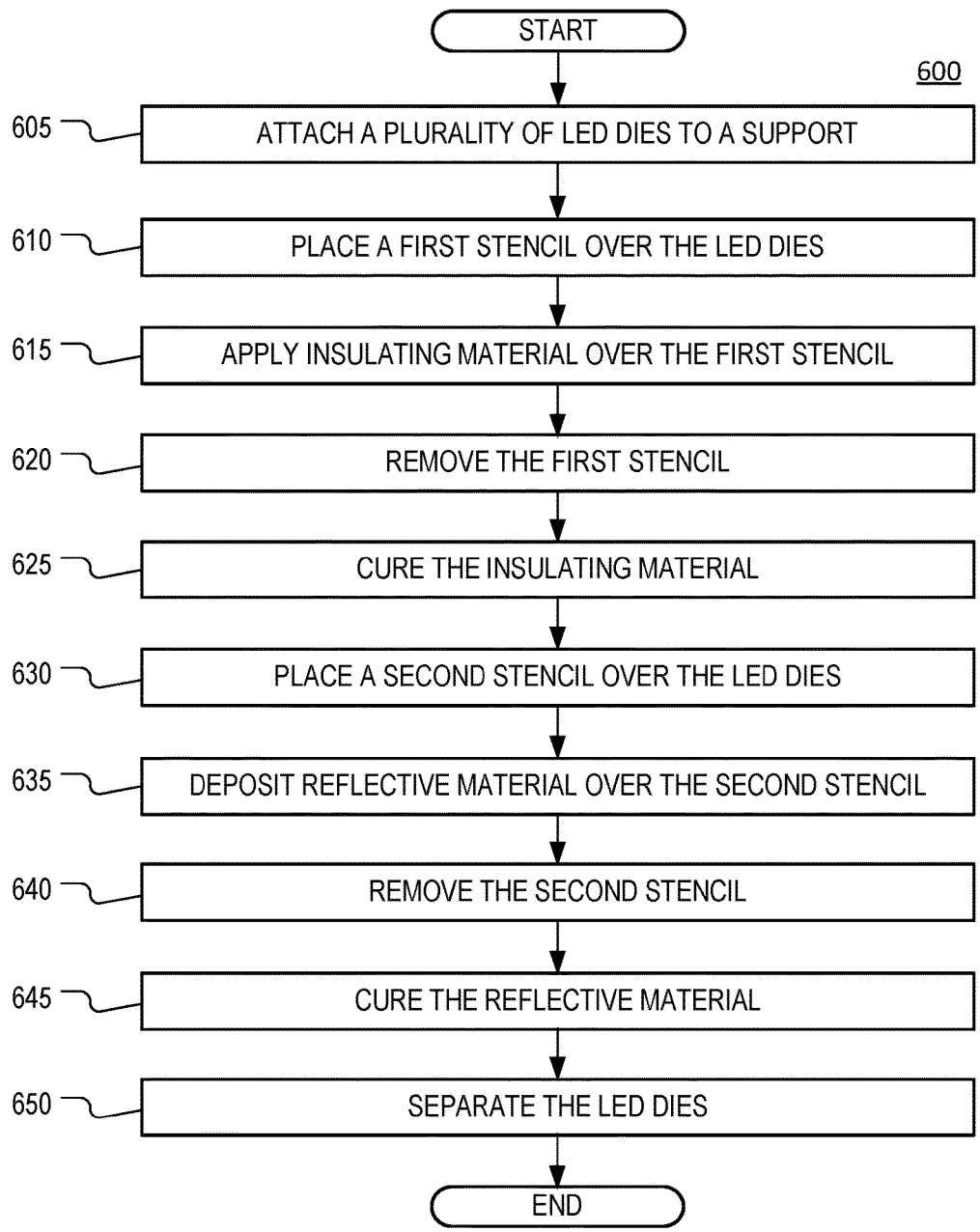
FIG. 6A is a flowchart of an example of a process for manufacturing light-emitting devices, according to aspects of the disclosure.

FIG. 6A is a flowchart of a process 600 for manufacturing light-emitting devices, such as the device 400 of FIG. 4A, according to aspects of the disclosure. The process 600 is described in conjunction with FIGS. 6B-J, which are cross-sectional views illustrating different manufacturing stages undergone by the light emitting devices.

Figure 6B:
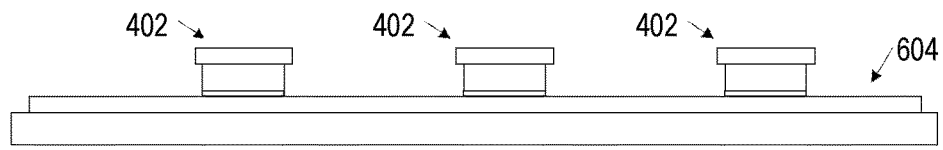
FIG. 6B is a schematic diagram illustrating a step in the process of FIG. 6A, according to aspects of the disclosure.

At step 605, a plurality of LED dies 402 are attached to a support 604, as shown in FIG. 6B. The support 604 may include an adhesive tape and/or any other suitable type of support.

Figure 6C:
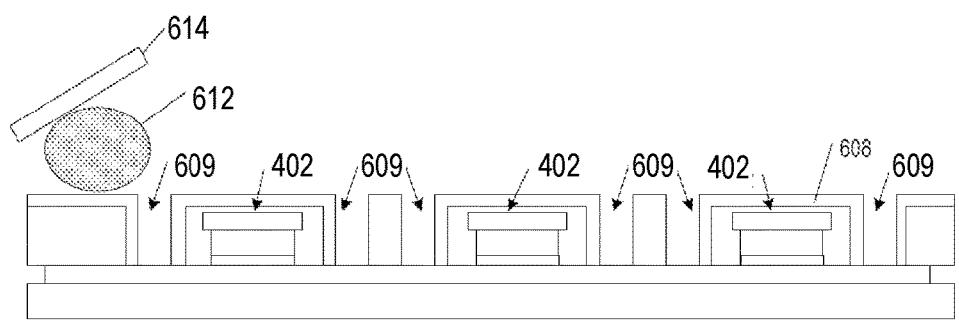
FIG. 6C is a schematic diagram illustrating a step in the process of FIG. 6A, according to aspects of the disclosure.

At step 610, a stencil 608 is placed over the LED dies 402, as shown in FIG. 6C. The stencil 608 may be a step stencil defining a trench 609 around each LED die 402. According to aspects of the disclosure, the stencil 608 may include any suitable type of stencil, such as an electroform stencil or a mesh stencil, for example.

Figure 6D:
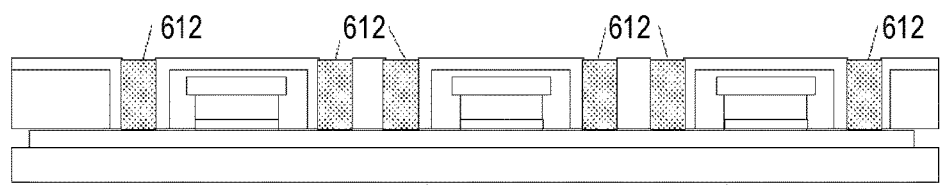
FIG. 6D is a schematic diagram illustrating a step in the process of FIG. 6A, according to aspects of the disclosure.

At step 615, an insulating material 612 is spread on the stencil 608 and deposited into the trenches 609, as shown in FIG. 6C. The insulating material 612 may be deposited using a squeegee 614. As shown in FIG. 6D, the trenches 609 become filled with the insulating material 612 when the application of the insulating material 612 is completed. In some implementations, the insulating material 612 may include a binder material filled with reflective particles. For example, the insulating material 612 may include silicone mixed with $TiO_2$ or white solder mask. As another, the insulating material 612 may include epoxy mixed with $TiO_2$ or white solder mask.

Figure 6E:
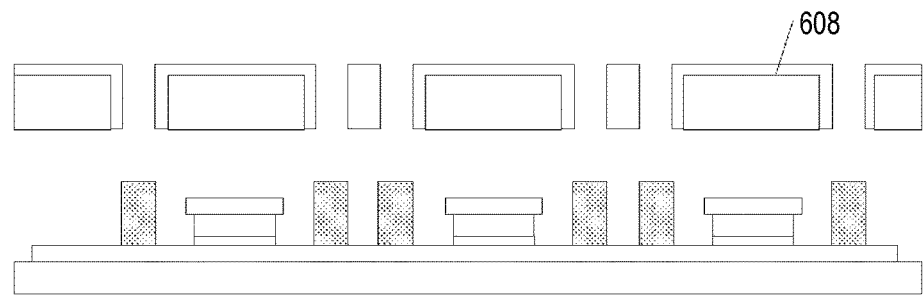
FIG. 6E is a schematic diagram illustrating a step in the process of FIG. 6A, according to aspects of the disclosure.
Figure 6F:
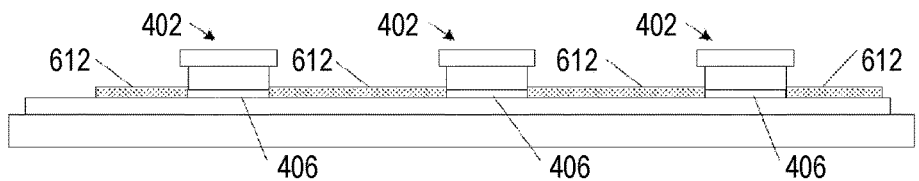
FIG. 6F is a schematic diagram illustrating a step in the process of FIG. 6A, according to aspects of the disclosure.

At step 620, the stencil 608 is removed, as shown in FIG. 6E After the stencil 608 is removed, the insulating material 612 is drawn to the edges of LED dies 402 by capillary action to cover at least the sides of their semiconductor structures 406, as shown in FIG. 6F.

At step 625, the insulating material 612 is cured to form insulating side coatings 412. In some implementations, the insulating material 612 may be only partially cured by heating up to 100-150 degrees Celsius. Partially curing the insulating material 612 may permit it to bond with the reflective material 628 (shown in FIG. 6G), when the latter is subsequently deposited and cured.

Figure 6G:
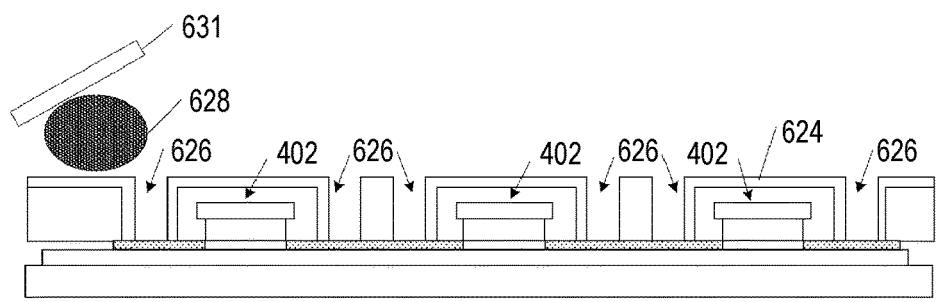
FIG. 6G is a schematic diagram illustrating a step in the process of FIG. 6A, according to aspects of the disclosure.

At step 630, a stencil 624 is placed over LED dies 402, as shown in FIG. 6G. The stencil 624 may be a step stencil defining a trench 626 around each LED die 402. According to aspects of the disclosure, the stencil 624 may include any suitable type of stencil, such as a 3D electroform stencil or a mesh stencil, for example.

Figure 6H:
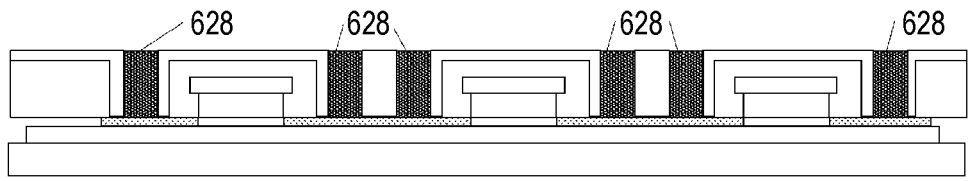
FIG. 6H is a schematic diagram illustrating a step in the process of FIG. 6A, according to aspects of the disclosure.

At step 635, reflective material 628 is spread on the stencil 624 and deposited into the trenches 626. As shown in FIG. 6D, the reflective material 628 may be deposited into the trenches 626 with a squeegee 631. As a result, the trenches 626 may become filled with the reflective material 628, as shown in FIG. 6H. In some implementations, the reflective material 628 may include a binder material that is filled metal powder. For example, the reflective material 628 may include a silver paste comprising solvent, binder, and additives that promote adhesion to the insulating material 612 and/or the wavelength converters 410 of the LED dies 402.

Figure 6I:
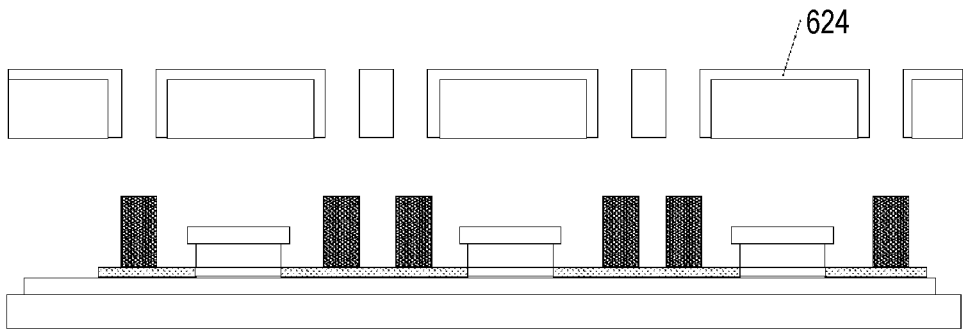
FIG. 6I is a schematic diagram illustrating a step in the process of FIG. 6A, according to aspects of the disclosure.
Figure 6J:
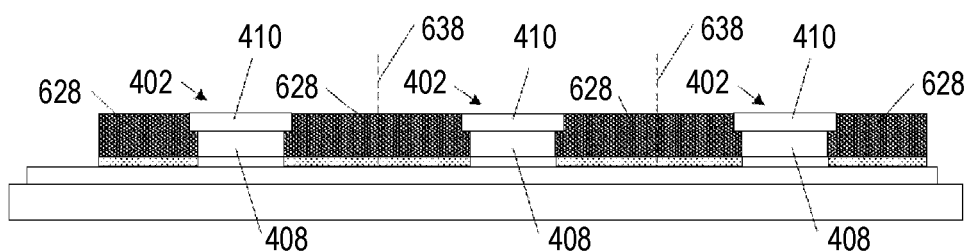
FIG. 6J is a schematic diagram illustrating a step in the process of FIG. 6A, according to aspects of the disclosure.

At step 640, the stencil 624 is removed as shown in FIG. 6I. After the stencil is removed, the reflective material 628 is drawn to the edges of the LED dies 402 by capillary action to cover at least the sides of their transparent substrates 408 and wavelength converters 410. As illustrated in FIG. 6J, after the reflective material 628 is drawn to the edges of the LED dies 402, it may form surfaces that are flush with the top surfaces of the LED dies 402.

At step 645, the reflective material 628 is cured to form reflective side coatings 414. In some implementations, the reflective material 628 may be sintered to burn off any solvent and form solid reflective side coatings 414. In instances in which the reflective material 628 includes a silver paste reflective material, it may have a low sintering temperature of about 220° C. and a short sintering time of about 2 hours. Additionally or alternatively, in some implementations, the additives remaining in solid reflective side coatings 414 promote adhesion between the reflective side coatings 414 and the transparent substrates 408 or wavelength converters 410. Additionally or alternatively, in instances in which the insulating material 612 is only partially cured at step 625, the curing of the insulating material may be completed at step 645. In some implementations, the concurrent curing of the insulating material 612 and the reflective material 628 may result in a stronger bond between the insulating side coatings 412 and reflective side coatings 414.

At step 650, the LED dies 402 are separated from each other and/or the support 604. As illustrated in FIG. 6J, the individual LEDs may be singulated from the support 604 along streets 638.

In some implementations, the trenches 609 may be sized to accept a sufficient quantity of insulating material 612 to cover the sides of the semiconductor structures of the LED dies 402. Additionally or alternatively, the trenches 626 may be sized to accept a sufficient quantity of insulating material 612 to cover the remaining portions of the LED dies 402 without overflowing onto the top surfaces of the wavelength converters 410. Additionally or alternatively, the trenches 626 may be deeper than the trenches 609. Additionally or alternatively, any of the trenches 609 and the trenches 626 may be deeper than the height of the LED dies 402.

FIGS. 1-6J are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light-emitting device, comprising:
a substrate;
a semiconductor structure disposed on the substrate, the semiconductor structure having an active region disposed between an n-type layer and a p-type layer;
a wavelength converter formed above the substrate;
an insulating side coating formed around the semiconductor structure; and
a reflective side coating formed around the wavelength converter and the substrate, the reflective side coating being stacked over the insulating side coating, the reflective side coating having a top surface that is flush with a top surface of the wavelength converter, and the reflective side coating having a bottom surface that is disposed above a top surface of the insulating side coating.

2. The light-emitting device of claim 1, wherein the reflective side coating is arranged to lead heat generated by the wavelength converter away from the wavelength converter.

3. The light-emitting device of claim 1, wherein the reflective side coating has a thermal conductivity of at least 200 W/mK.

4. The light-emitting device of claim 1, wherein:
the insulating side coating includes a first binder material filled with reflective particles, and
the reflective side coating includes a second binder material filled with a metal powder.

5. The light-emitting device of claim 1, wherein:
the wavelength converter includes a plurality of sidewalls,
the wavelength converter is wider than the substrate, such that a portion of a bottom surface of the wavelength converter overhangs the substrate, and
the reflective side coating is thermally coupled with the plurality of sidewalls of the wavelength converter and the portion of the bottom surface of the wavelength converter that overhangs the substrate.

6. The light-emitting device of claim 1, wherein the insulating side coating is arranged to insulate the semiconductor structure from the reflective side coating.

7. The light-emitting device of claim 1, wherein the reflective side coating includes silver.

8. A light-emitting device, comprising:
a light-emitting diode (LED) die including a semiconductor structure and a wavelength converter formed above the semiconductor structure;
an insulating side coating formed around the LED die, the insulating side coating including a first binder material filled with reflective particles; and
a reflective side coating formed around the LED die, the reflective side coating being stacked over the insulating side coating, the reflective side coating including a second binder material filled with metal powder, the reflective side coating being thermally coupled to the wavelength converter, the reflective side coating having a top surface that is flush with a top surface of the wavelength converter, and the reflective side coating having a bottom surface that is disposed over a top surface of the insulating side coating.

9. The light-emitting device of claim 8, wherein the reflective side coating includes a silver material, a binder, and at least one additive that is arranged to promote adhesion between the wavelength converter and the reflective side coating.

10. The light-emitting device of claim 8, wherein the insulating side coating is arranged to surround the semiconductor structure and substantially cover one or more sides of the semiconductor structure.

11. The light-emitting device of claim 8, wherein the insulating side coating is arranged to insulate the semiconductor structure from the reflective side coating.

12. The light-emitting device of claim 8, wherein the reflective side coating is arranged to surround the wavelength converter and substantially cover one or more sides of the wavelength converter.

13. The light-emitting device of claim 8, wherein the reflective side coating is arranged to lead heat generated by the wavelength converter away from the wavelength converter.

14. The light-emitting device of claim 8, further comprising a substrate disposed between the wavelength converter and the semiconductor structure, wherein:
the wavelength converter includes a plurality of sidewalls,
the wavelength converter is wider than the substrate, such that a portion of a bottom surface of the wavelength converter overhangs the substrate, and
the reflective side coating is thermally coupled with the plurality of sidewalls of the wavelength converter and the portion of the bottom surface of the wavelength converter that overhangs the substrate.

15. A method for manufacturing a light-emitting device, comprising:
placing a light emitting diode (LED) die on a support, the LED die including:
a semiconductor structure having an active region disposed between an n-type layer and a p-type layer; and
a wavelength converter formed above the semiconductor structure;
forming an insulating side coating around the semiconductor structure; and
forming a reflective side coating around the wavelength converter by stacking the reflective side coating over the insulating side coating, the reflective side coating having a top surface that is flush with a top surface of the wavelength converter, and the reflective side coating having a bottom surface that is disposed over a top surface of the insulating side coating.

16. The method of claim 15, wherein forming the insulating side coating comprises:

placing a stencil on the LED die, the stencil defining a trench around the LED die;
applying an insulating material into the trench; and
causing the insulating material to spread towards one or more sidewalls of the semiconductor structure by removing the stencil.

17. The method of claim 16, wherein the trench is deeper than a height of the semiconductor structure, and the insulating material is applied in sufficient amounts to substantially cover one or more sidewalls of the semiconductor structure when the stencil is removed.

18. The method of claim 15, wherein forming the reflective side coating comprises:
placing a stencil on the LED die, the stencil defining a trench around the LED die;
applying a reflective material into the trench; and
removing the stencil to allow the reflective material to spread towards one or more sidewalls of the wavelength converter.

19. The method of claim 18, wherein the reflective material is applied in sufficient amounts to substantially cover one or more sidewalls of the wavelength converter when the stencil is removed without overflowing onto the top surface of the wavelength converter.

20. The method of claim 15, wherein:
a substrate is disposed over the semiconductor structure,
the wavelength converter is disposed over the substrate,
the wavelength converter is wider than the substrate, such that a portion of a bottom surface of the wavelength converter overhangs the substrate, and
the reflective side coating is thermally coupled with a plurality of sidewalls of the wavelength converter and the portion of the bottom surface of the wavelength converter that overhangs the substrate.

* * * * *